United States Patent [19]

Kim

[11] Patent Number: 5,780,333

[45] Date of Patent: Jul. 14, 1998

[54] METHOD OF FABRICATING AN ANALOG SEMICONDUCTOR DEVICE HAVING A SALICIDE LAYER

[75] Inventor: Jae-Kap Kim, Ich'on, Rep. of Korea

[73] Assignee: Hyundai Electronics Industries Co., Ltd., Ich'on, Rep. of Korea

[21] Appl. No.: 882,745

[22] Filed: Jun. 26, 1997

[30] Foreign Application Priority Data

Jun. 29, 1996 [KR] Rep. of Korea ............... 1996-26313

[51] Int. Cl.$^6$ .................................................. H01L 21/8234
[52] U.S. Cl. ........................ 438/238; 438/250; 438/382; 438/253
[58] Field of Search ................................. 438/238, 250, 438/253, 382, 393, 394

[56] References Cited

U.S. PATENT DOCUMENTS 5,134,088  7/1992  Zetterlund .
5,597,759  1/1997  Yoshimori .
5,618,749  4/1997  Takahashi et al. ................ 438/384

*Primary Examiner*—Jey Tsai
*Attorney, Agent, or Firm*—Ware, Fressola, Van Der Sluys & Adolphson LLP

[57] ABSTRACT

An analog semiconductor device having a salicide(self-aligned silicide) layer and a method of fabricating the same are disclosed. An isolation layer is formed on a semiconductor substrate to define an active region, and a resistor is formed on the isolation layer. A capacitor insulating layer and dummy upper capacitor electrode are formed on a predetermined portion of the resistor, and a salicide layer is selectively formed on the dummy upper capacitor electrode and exposed portions of the resistor. The dummy upper capacitor electrode and one side of the exposed portion of the resistor are electrically connected to each other, to thereby form the analog semiconductor device.

2 Claims, 3 Drawing Sheets

METHOD OF FABRICATING AN ANALOG SEMICONDUCTOR DEVICE HAVING A SALICIDE LAYER

BACKGROUND OF THE INVENTION

1. Field of the Invention

The present invention relates to a semiconductor device and a method of fabricating the same, and more particularly, to an analog semiconductor device having a salicide layer and a method of fabricating the same.

2. Discussion of Related Art

While a digital semiconductor device stores information in only two states, LOW and HIGH, an analog semiconductor device stores information in various states. The analog semiconductor device includes a resistor and capacitor at each node of its circuit. Since the resistance and capacitance vary with voltage, a resistor having a specific value is required.

As semiconductor devices are highly integrated, a self-aligned silicide (salicide) layer is introduced in the fabrication of the semiconductor devices in order to reduce parasitic resistance effect and improve conductivity. The salicide layer is formed in such a manner that a metal layer or metal silicide layer is selectively self-aligned formed on the surface of the gate, source and drain of the device. The salicide layer is also formed on the resistor of the analog semiconductor device. In order to form the resistor having a specific value, it is required that the salicide layer is not formed on the polysilicon resistor by additional process. For this reason, a capacitor insulating layer and dummy upper capacitor electrode are formed on a specific portion of the polysilicon resistor in a conventional method.

FIG. 1 shows a cross-sectional view of the conventional analog semiconductor device having a polysilicon resistor. Referring to FIG. 1, a field oxide layer 20 is formed on a semiconductor substrate 10, to define an active region A. A gate insulating layer 30, gate electrode 41, source and drain regions 50a and 50b are formed in active region A, and a polysilicon resistor 42 is formed on field oxide layer 20. A capacitor insulating layer 60 and dummy upper capacitor electrode 70 are sequentially formed on a predetermined portion of the polysilicon resistor 42. An insulating layer spacer 80 is formed on each side of the gate electrode 41, the polysilicon resistor 42 and the dummy upper capacitor electrode 70.

A salicide layers 90a–90f is selectively formed on the source region 50a, the drain region 50b, the gate electrode 41, exposed portions of the polysilicon resistor 42 and the dummy upper capacitor electrode 70, respectively. An intermediate insulating layer 100 is formed on the overall surface of the substrate, and selectively etched, to expose a predetermined portion of salicide layer 90a and 90b formed on the source and drain regions 50a and 50b, and the salicide layer 90d and 90e formed on polysilicon resistor 42, to thereby form contact holes. A metal layer is formed on the intermediate insulating layer 100 to fill the contact holes, and then patterned, to thereby form metal interconnection layer 120a–120d.

In the above-described conventional semiconductor device, the capacitor insulating layer 60 and the dummy upper capacitor electrode 70 serve as a barrier for the polysilicon resistor 42 when the salicide layers 90a–90f is selectively formed. Accordingly, the salicide layers 90a–90f are not formed on a specific portion of the polysilicon resistor 42.

FIG. 2 is an equivalent circuit diagram of portion B of FIG. 1. Referring to FIG. 2, the capacitor insulating layer 60 and the dummy upper capacitor electrode 70 formed on the polysilicon resistor 42 are in floating state, and thus act as a parasitic capacitor Cp for polysilicon resistor 42. Accordingly, the value of the polysilicon resistor 42 varies with the change of voltage, resulting in a poor circuit and deterioration of reliability in the analog semiconductor device.

SUMMARY OF THE INVENTION

Accordingly, the present invention is directed to an analog semiconductor device and a method of fabricating the same that substantially obviates one or more of the problems due to limitations and disadvantages of the related art.

An object of the present invention is to provide an analog semiconductor device and a method of fabricating the same, in which a polysilicon resistor does not vary with the change of voltage, to prevent its circuit from malfunctioning. To accomplish the object of the present invention, an analog semiconductor device is constructed in such a manner that an isolation layer is formed on a semiconductor substrate to define an active region, a resistor is formed on the isolation layer, a capacitor insulating layer and dummy upper capacitor electrode are formed on a predetermined portion of the resistor, and a salicide layer is selectively formed on the dummy upper capacitor electrode and exposed portions of the resistor. The dummy upper capacitor electrode and one side of the exposed portions of the resistor are electrically connected to each other.

A method of fabricating an analog semiconductor device according to the present invention is such that: an isolation layer is formed on a semiconductor substrate to define an active region; a resistor is formed on a predetermined portion of the isolation layer; a capacitor insulating layer and dummy upper capacitor electrode are formed on a predetermined portion of the resistor; and a salicide layer is selectively formed on the dummy upper capacitor electrode and exposed portions of the resistor. An intermediate insulating layer is formed on the substrate, and the intermediate insulating layer is etched, to form first and second contact holes exposing a predetermined portion of the salicide layer formed on the resistor, to form a third contact hole exposing a predetermined portion of the salicide layer formed on the dummy upper capacitor electrode. A conductivity layer is then formed on the intermediate insulating layer to fill the first, second and third contact holes. The conductivity layer is patterned to form a first metal line electrically connecting the resistor to the dummy capacitor electrode through the first and second contact holes, and second interconnection layer coming into contact with the salicide layer formed on the resistor through the second contact hole.

The objectives and other advantages of the invention will be realized and attained by the structure particularly pointed out in the written description and claims hereof as well as the appended drawings. Furthermore, it is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

3

DETAILED DESCRIPTION OF THE INVENTION

Figure 1:
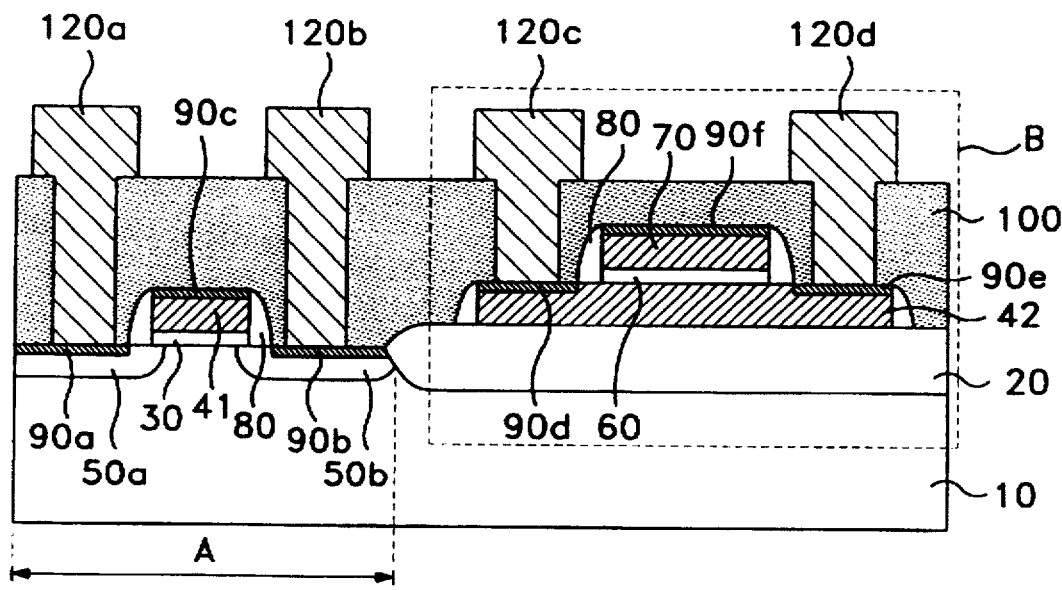
FIG. 1 is a cross-sectional view of a conventional analog semiconductor device having a polysilicon resistor.
Figure 2:
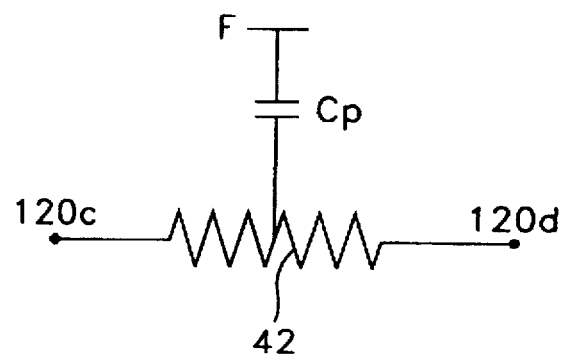
FIG. 2 is an equivalent circuit diagram of portion B of FIG. 1.

Reference will now be made in detail to the preferred embodiments of the present invention, examples of which are illustrated in the accompanying drawings. For clarity, component reference numerals are consistent between all the drawing.

Figure 3A:
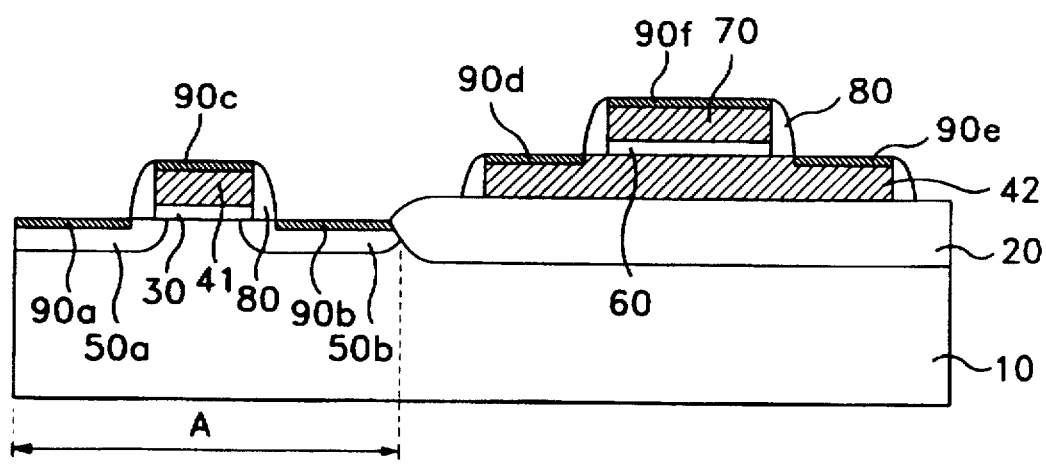
FIGS. 3A, 3B and 3C are cross-sectional views showing a method of fabricating an analog semiconductor device having a polysilicon resistor in accordance with an embodiment of the present invention.
Figure 3B:
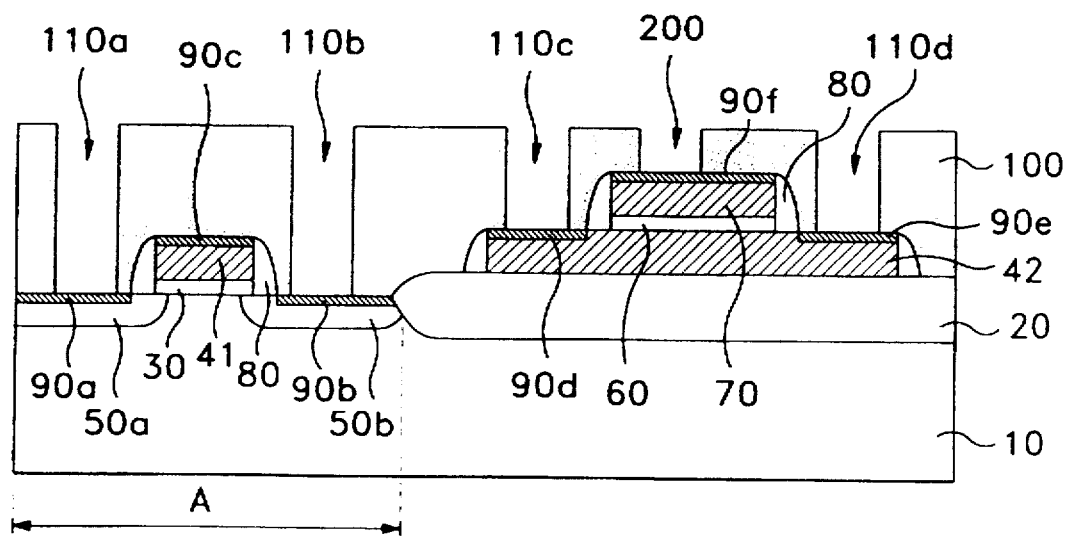
Figure 3C:
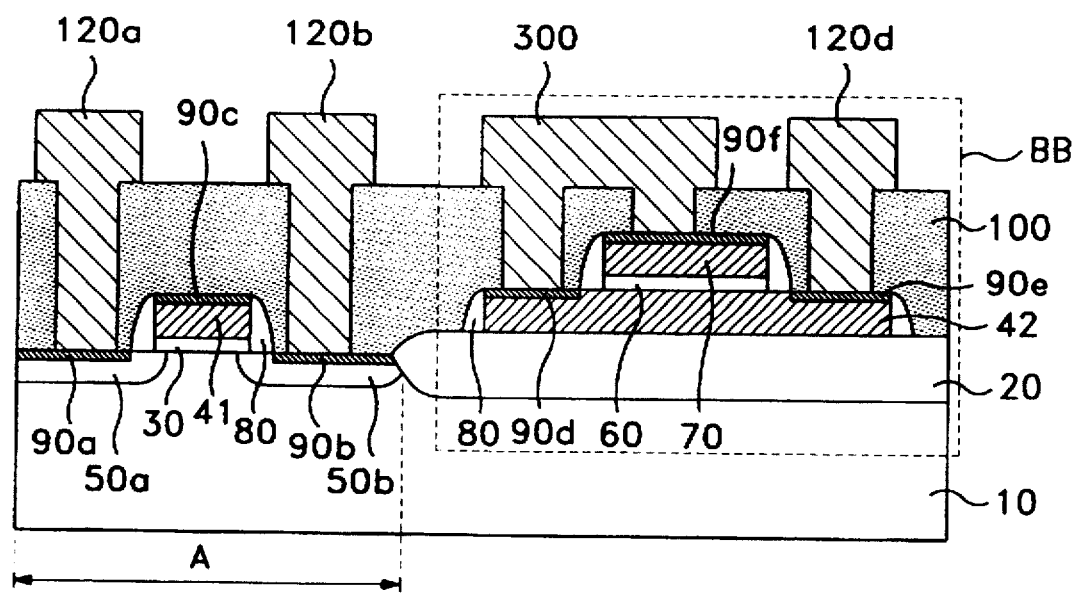

FIGS. 3A, 3B and 3C are cross-sectional views showing a method of fabricating an analog semiconductor device having a polysilicon resistor in accordance with an embodiment of the present invention. Referring to FIG. 3A, a field oxide layer 20 is formed on a semiconductor substrate 10 using local oxidation of silicon (LOCOS) method, to define an active region A. An insulating layer and polysilicon layer are sequentially formed on the substrate, and then patterned, to form a gate insulating layer 30 and gate 41 on the active region A, polysilicon resistor 42 on field oxide layer 20, and lower capacitor electrode (not shown) on a predetermined portion of the substrate.

Impurities are implanted into the active region A, placed on both sides of the gate 41, to form source and drain regions 50a and 50b. An insulating layer and polysilicon layer are sequentially formed on the overall surface of the substrate, and then patterned, to thereby form a capacitor insulating layer and upper capacitor electrode (not shown) on the capacitor lower electrode(not shown), and capacitor insulating layer 60 and dummy upper capacitor electrode 70 on a predetermined portion of polysilicon resistor 42.

Thereafter, an insulating layer is formed on the overall surface of the substrate, and etched by anisotropic blanket etching, to expose the surface of gate 41 and the dummy upper capacitor electrode 70. As a result, an insulating layer spacer 80 is formed on both side wall of the gate 41, the polysilicon resistor 42 and the dummy upper capacitor electrode 70. Salicide layer 90a–90f is selectively formed on the source and drain regions 50a and 50b, the gate 41, the exposed portions of the polysilicon resistor 42 and the dummy upper capacitor electrode 70, respectively. Here, the capacitor insulating layer 60 and the dummy upper capacitor electrode 70 formed on a predetermined portion of the polysilicon resistor 42 serve as a barrier for the polysilicon resistor 42 when the salicide layer is selectively formed. Thus, the salicide layer 90d and 90e is formed only on the exposed portion of the polysilicon resistor 42.

Referring to FIG. 3B, an intermediate insulating layer 100 is formed on the overall surface of the substrate, and is then selectively etched, to expose a predetermined portion of the salicide layer 90a–90f, forming contact holes 110a, 110b, 110c, 110d and 200. Referring to FIG. 3C, a metal layer is then deposited to fill the contact holes 110a to 110d and 200, and then patterned, to form metal interconnection layers 120a, 120b, 120d, and metal interconnection layer 300, and thus electrically connect one side of the polysilicon resistor 42 to dummy upper capacitor electrode 70.

Figure 4:
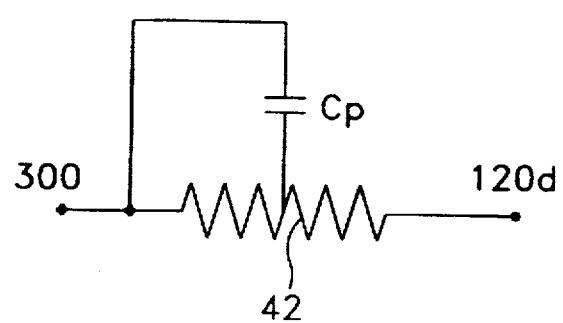
FIG. 4 is an equivalent circuit diagram of the polysilicon resistor in accordance with the embodiment of the present invention.

FIG. 4 is an equivalent circuit diagram of portion BB of FIG. 3. Dummy upper capacitor electrode 70 is electrically connected to one side of polysilicon resistor 42, and thus act as a parasitic capacitor Cp for polysilicon resistor 42.

According to the above-described embodiment of the present invention, the capacitor insulating layer and dummy upper capacitor electrode formed on a predetermined portion of the polysilicon resistor serve as a barrier for the polysilicon resistor when the salicide layer is selectively formed. Furthermore, the dummy upper capacitor electrode is connected to one side of the polysilicon resistor, acting as a parasitic capacitor for the polysilicon resistor. Accordingly, the resistance of the polysilicon resistor does not vary with voltage. As a result the operation of the device is stabilized and the reliability of the semiconductor device is improved.

In the aforementioned embodiment, while the polysilicon resistor and lower capacitor electrode are simultaneously patterned when the gate electrode is formed, it is also possible to form first the polysilicon resistor and lower capacitor electrode, simultaneously form the gate insulating layer and capacitor insulating layer, and then simultaneously form the upper capacitor electrode and gate electrode.

It will be apparent to those skilled in the art that various modifications and variations can be made in the analog semiconductor device and a method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an analog semiconductor device wherein an isolation layer is formed on a semiconductor substrate to define an active region, a resistor is formed on a predetermined portion of the isolation layer, a capacitor insulating layer and dummy upper capacitor electrode are formed on a predetermined portion of the resistor, and a salicide layer is selectively formed on the dummy upper capacitor electrode and exposed portions of the resistor, the method comprising the steps of:

forming an intermediate insulating layer on the substrate;

etching the intermediate insulating layer, to form first and second contact holes exposing predetermined portions of the salicide layer formed on the resistor, and a third contact hole exposing a predetermined portion of the salicide layer formed on the dummy upper capacitor electrode;

forming a conductivity layer on the intermediate insulating layer, to fill the first, second and third contact holes; and patterning the conductivity layer, to form a first interconnection layer electrically connecting the resistor to the dummy capacitor electrode through the first and second contact holes, and second interconnection layer coming into contact with the salicide layer formed on the resistor through the second contact hole.

2. The method of fabricating an analog semiconductor device as claimed in claim 1, wherein the resistor is formed of polysilicon.

* * * * *